United States Patent
Hirota et al.

(10) Patent No.: US 9,369,109 B2
(45) Date of Patent: Jun. 14, 2016

(54) SURFACE ACOUSTIC WAVE DEVICE AND OSCILLATOR CIRCUIT

(71) Applicant: NIHON DEMPA KOGYO CO., LTD., Tokyo (JP)

(72) Inventors: Kazuhiro Hirota, Saitama (JP); Osamu Tokuda, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/548,219

(22) Filed: Nov. 19, 2014

(65) Prior Publication Data

US 2015/0137903 A1    May 21, 2015

(30) Foreign Application Priority Data

Nov. 20, 2013    (JP) .................................. 2013-240015

(51) Int. Cl.
*H03B 5/32*    (2006.01)
*H03H 9/02*    (2006.01)
(Continued)

(52) U.S. Cl.
CPC ............ *H03H 9/02551* (2013.01); *H03B 5/326* (2013.01); *H03H 3/10* (2013.01); *H03H 9/02834* (2013.01); *H03H 9/02992* (2013.01); *H03H 9/13* (2013.01); *H03H 9/25* (2013.01)

(58) Field of Classification Search
CPC ............ H03B 5/30; H03B 5/32; H03B 5/326; H03H 9/0009; H03H 9/0028; H03H 9/02535; H03H 9/02543; H03H 9/02551; H03H 9/02637; H03H 9/02763; H03H 9/02818; H03H 9/02834; H03H 9/02992; H03H 9/058; H03H 9/1064; H03H 9/145; H03H 9/14505; H03H 9/14508; H03H 9/25; H03H 9/42; H03H 9/64; H03H 9/6406; H03H 9/6423; H03H 9/6489

USPC .................. 310/313 A, 313 B, 313 D, 313 R; 331/154, 158; 333/193–196
See application file for complete search history.

(56) References Cited

U.S. PATENT DOCUMENTS 5,432,392 A * 7/1995 Kadota et al. ............. 310/313 A
6,329,888 B1 * 12/2001 Hirota ........................... 333/193
(Continued)

FOREIGN PATENT DOCUMENTS

JP    07-183760    7/1995
JP    2003-069380    3/2003
(Continued)

OTHER PUBLICATIONS

Shimizu et al., "A New Cut of Quartz for SAW Devices with extremely Small Temperature Coefficient by Leaky Surface Wave", The Transaction of the Institute of Electronics and Communication Engineers of Japan, Aug. 1985, pp. 613-619, vol. J68-C. No. 8.
(Continued)

*Primary Examiner* — Levi Gannon
(74) *Attorney, Agent, or Firm* — Jiang Chyun Intellectual Property Office (57) ABSTRACT

A surface acoustic wave device includes a quartz substrate and a periodic structure portion. The quartz substrate is constituted such that a surface acoustic wave is to propagate on a surface with an Euler angle of (0°, 16°<θ≤18.5°, 0°). The periodic structure portion is disposed on the quartz substrate and includes a plurality of electrodes extending in a direction intersecting with a direction of the propagation of the surface acoustic wave. The electrodes are disposed in parallel to one another along the propagation direction. The periodic structure portion is constituted to mainly contain aluminum. When a width dimension of the electrode in the propagation direction and a separation dimension between the electrodes adjacent to one another are respectively defined as L and S, a metallization ratio η (η=L÷(L+S)) is set to 0.4 or less.

19 Claims, 9 Drawing Sheets

SURFACE ACOUSTIC WAVE (51) Int. Cl.
*H03H 9/25* (2006.01)
*H03H 3/10* (2006.01)
*H03H 9/13* (2006.01)

(56) References Cited

U.S. PATENT DOCUMENTS

| | | | |
|---|---|---|---|
| 7,285,894 B1* | 10/2007 | da Cunha | 310/313 A |
| 7,446,453 B1* | 11/2008 | Naumenko et al. | 310/313 A |
| 8,436,510 B2* | 5/2013 | Yamane et al. | 310/313 R |
| 9,059,676 B2* | 6/2015 | Hirota et al. | |
| 2002/0053856 A1* | 5/2002 | Inoue et al. | 310/313 A |
| 2003/0234705 A1* | 12/2003 | Abbott et al. | 333/193 |
| 2006/0131992 A1* | 6/2006 | Nakao et al. | 310/313 B |
| 2007/0252475 A1* | 11/2007 | Okaguchi et al. | 310/313 R |
| 2012/0176001 A1* | 7/2012 | Kadota | 310/313 A |
| 2014/0028414 A1* | 1/2014 | Chamaly et al. | 333/193 |
| 2014/0319964 A1* | 10/2014 | Andle et al. | 310/313 A |

FOREIGN PATENT DOCUMENTS

| | | |
|---|---|---|
| JP | 2007-221840 | 8/2007 |
| JP | 2010-103720 | 5/2010 |

OTHER PUBLICATIONS

Yasushi Yamamoto, "SAW Filters and Resonators for Public Communication Systems", Ultrasonics Symposium, 1993. Proceedings., IEEE 1993, Oct. 1993, pp. 95-103, vol. 1.

Lam et al., "The Temperature Dependency of Power Leakage in LST-Cut Quartz Surface Acoustic Wave Filters", Ultrasonics Symposium, 1989. Proceedings., IEEE 1989, Oct. 1989, pp. 275-279, vol. 1.

Murota et al., "Comparison of the Theoretical Temperature Dependence of Power Leakage With Experiments on LST-Cut Quartz", Ultrasonics Symposium, 1990. Proceedings., IEEE 1990, Dec. 1990, pp. 497-500, vol. 1.

* cited by examiner

SURFACE ACOUSTIC WAVE DEVICE AND OSCILLATOR CIRCUIT

CROSS-REFERENCE TO RELATED APPLICATIONS

This application claims the priority benefit of Japanese application serial no. 2013-240015, filed on Nov. 20, 2013. The entirety of the above-mentioned patent application is hereby incorporated by reference herein and made a part of specification.

TECHNICAL FIELD

This disclosure relates to a surface acoustic wave device and an oscillator circuit that includes the surface acoustic wave device.

DESCRIPTION OF THE RELATED ART

A device using surface acoustic waves employs a configuration where electrodes extending in straight lines are periodically disposed on a piezoelectric substrate. Concrete examples of the above-described configuration include an inter digital transducer (IDT) electrode where electrode fingers are disposed in a comb shape. As the above-described device, for example, a surface acoustic wave (SAW) filter where the IDT electrodes are disposed as an input-side electrode and an output-side electrode, a SAW resonator where reflectors are formed on both sides of the IDT electrode, and similar device are known.

The already-described piezoelectric substrate employs, for example, a quartz substrate. Among cut angles of this quartz substrate, for example, an LST cut is known as a cut angle that allows obtaining a satisfactory frequency/temperature characteristic compared with an ST cut (see Shimizu, Tanaka, The Transaction of the Institute of Electronics and Communication Engineers of Japan, Vol. J68-C. No. 8, pp. 613-619, 1985/Journal of the Acoustical Society of Japan Vol. 43 No. 12, pp. 921-927, 1987). That is, a frequency/temperature characteristic curve is a quadratic function graph that is convex downward as seen from the graph described below. The apex in this curve moves the direction in the X-axis (the axis representing temperature) corresponding to the film thickness dimension of the electrode. Accordingly, in the case where the device using the ST cut or the LST cut is designed, the film thickness dimension of the electrode is set such that the apex of the temperature characteristic curve is plotted in a mid-range of the use temperature so as to reduce the frequency-temperature deviation.

The second order coefficient of the frequency/temperature characteristic curve is 0.032 ppm/° $C.^2$ for the ST cut while the second order coefficient is 0.009 ppm/° $C.^2$ for the LST cut and is equal to or less than ⅓ of the second order coefficient for the ST cut. Accordingly, the frequency deviation of the LST cut in any temperature range (the use temperature range of the device) also becomes equal to or less than ⅓ of the frequency deviation of the ST cut. Here, the film thickness dimension of the optimal electrode thus obtained becomes thinner in the LST cut than that in the ST cut.

Here, for the LST cut, the cut angle of the quartz substrate in the Euler angle representation is (0°, 15°~16°, 0°). In the LST cut, the leaky SAW propagates at a speed of 3950 m/s. Accordingly, the LST cut is advantageous for a high-frequency device, and is put into practical use as, for example, a filter or an oscillator for extracting the timing of optical communication (see Y. Yamamoto, Proc. IEEE 1993 Ultrasonics Symposium, pp. 95-103.). However, for example, when a device that operates in the high frequency band exceeding 600 MHz is intended to be designed, the film thickness dimension of the electrode might fall below the lower limit value of the film that can be formed by a realistic manufacturing method (sputtering or CVD). Accordingly, in the case where the LST cut is used, it is impossible or extremely difficult to produce a device excellent in temperature characteristic for high-frequency driving as described above. Even in the case where an extremely thin electrode with this film thickness dimension can be manufactured, the energy loss is increased due to the electrical resistance of the electrode.

Japanese Unexamined Patent Application Publication Nos. 2003-69380, 2010-103720, and 2007-221840 disclose the relationships between a wavelength-ratio film thickness (h/λ) and a cut angle (θ) but do not disclose a study on the above-described problem. Additionally, FIG. 6 in Japanese Unexamined Patent Application Publication No. 7-183760 illustrates the correlation relationship between an equivalent series resistance R1 and a temperature. In practice, the equivalent series resistance R1 degrades (increases) in association with an increase in temperature. Accordingly, it can be said that the evaluation carried out in Japanese Unexamined Patent Application Publication No. 7-183760 is not very accurate.

A need thus exists for a surface acoustic wave device and an oscillator circuit which are not susceptible to the drawback mentioned above.

SUMMARY

A surface acoustic wave device of this disclosure includes a quartz substrate and a periodic structure portion. The quartz substrate is constituted such that a surface acoustic wave is to propagate on a surface with an Euler angle of (0°, θ, 0°). A cut angle θ has 16°<θ≤18.5°. The periodic structure portion is disposed on the quartz substrate. The periodic structure portion includes a plurality of electrodes extending in a direction intersecting with a direction of the propagation of the surface acoustic wave. The electrodes are disposed in parallel to one another along the propagation direction. The periodic structure portion is constituted to mainly contain aluminum. When a width dimension of the electrode in the propagation direction and a separation dimension between the electrodes adjacent to one another are respectively defined as L and S, a metallization ratio η (η=L÷(L+S)) is set to 0.4 or less.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

[Overview of Surface Acoustic Wave Device]

Figure 1:
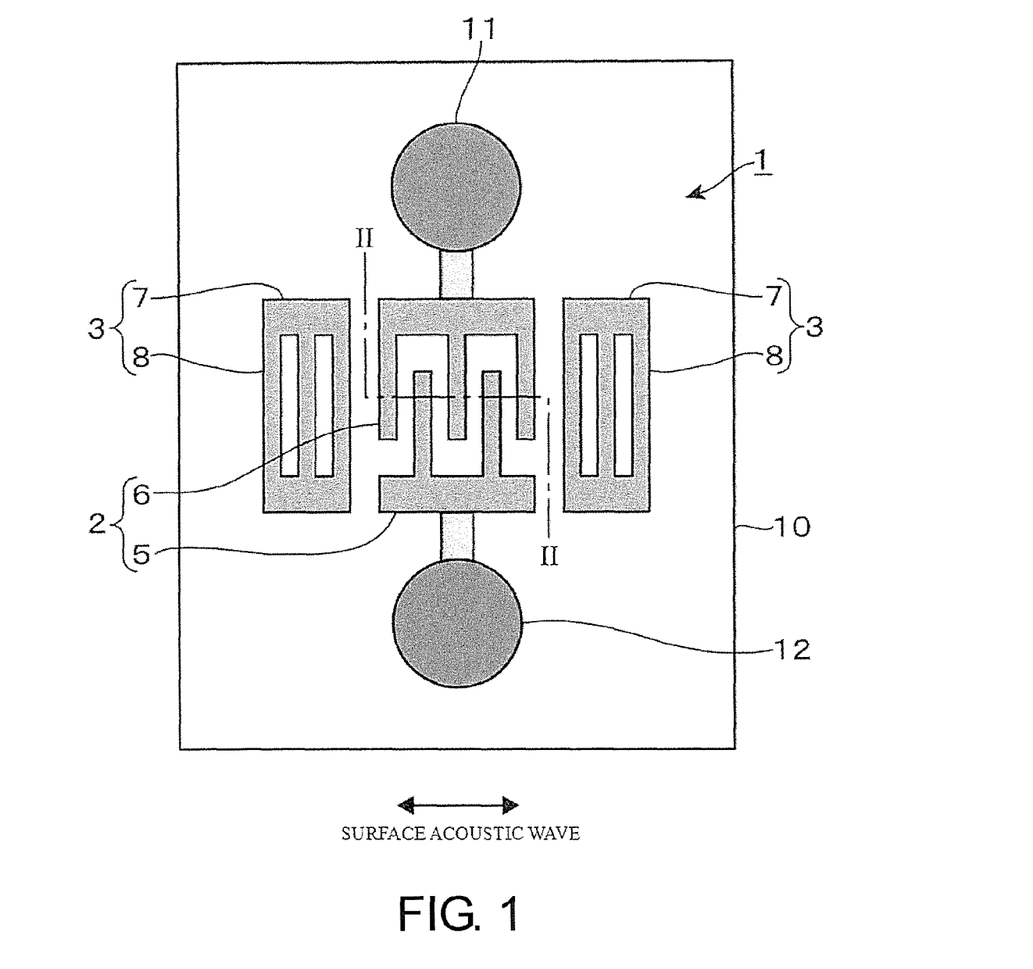
FIG. 1 is a plan view illustrating an exemplary surface acoustic wave device of this disclosure.
Figure 2:
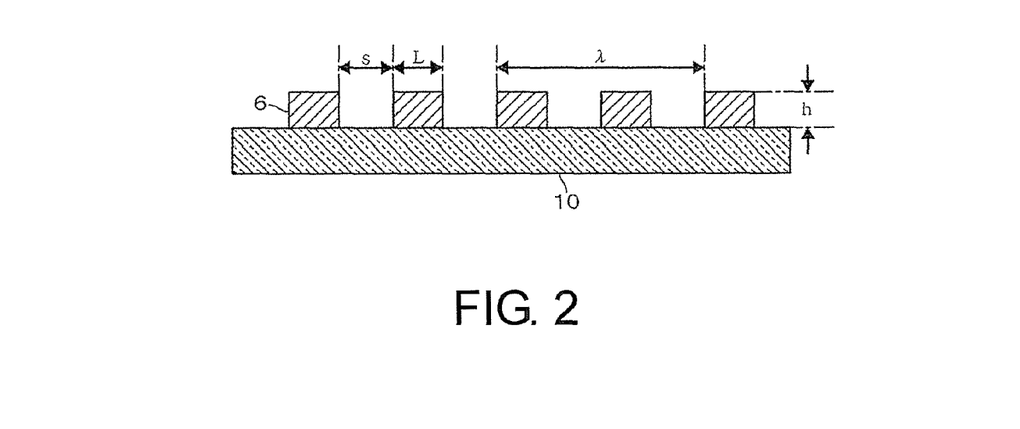
FIG. 2 is a vertical cross-sectional view illustrating the surface acoustic wave device.

A description will be given of an exemplary embodiment of a surface acoustic wave device according to this disclosure with reference to FIG. 1 and FIG. 2. This surface acoustic wave device is constituted such that a one-port type resonator 1 is disposed on a quartz substrate 10 as illustrated in FIG. 1. The quartz substrate 10 is cut such that surface acoustic waves (SAW) propagate on the surface with an Euler angle of (0°, θ, 0°). The angle θ is 16°<θ≤18.5°. The resonator 1 is formed of a conductive film mainly containing aluminum (Al) (with 90 weight % or more of aluminum contained in the conductive film). In the configuration of this example, surface acoustic waves propagate in right-left direction in FIG. 1, an input port 11 and an output port 12 are illustrated.

The resonator 1 includes an IDT electrode 2 and reflectors 3. The respective reflectors 3 are formed on one side and on the other side of the IDT electrode 2 in the propagation direction of the surface acoustic wave. The IDT electrode 2 includes a pair of busbars 5 and a plurality of electrode fingers 6. The respective busbars 5 are disposed to extend along the propagation direction of the surface acoustic wave and to be parallel to each other. The electrode fingers 6 are formed in a comb shape to intersect with one another between these busbars 5. In this example, the IDT electrode 2 forms a conventional electrode. In the conventional electrode, the electrode finger 6 extending from the busbar 5 on the one side of the pair of busbars 5 and the electrode finger 6 extending from the busbar 5 on the other side adjacent to this electrode finger 6 are alternately disposed along the propagation direction of the surface acoustic wave in FIG. 1. In FIG. 1, reflector busbars 7 and reflector electrode fingers 8 are illustrated. These electrode fingers 6 or reflector electrode fingers 8 constitute a periodic structure portion of the electrode.

Here, the width dimension of the electrode finger 6 in the propagation direction of the surface acoustic wave is defined as L, and the separation dimension between the electrode fingers 6 and 6 adjacent to each other is defined as S. Each electrode finger 6 is constituted as illustrated in FIG. 2. The respective width dimension L of the two electrode fingers 6 and 6 adjacent to each other and the separation dimension S between these electrode fingers 6 and 6 constitute a period length λ. The period length λ is the wavelength corresponding to the frequency of the surface acoustic wave (leaky SAW) propagating on the quartz substrate 10. Specifically, the period length λ is constituted such that a surface acoustic wave with a resonance frequency f of 600 MHz or more propagates. A metallization ratio η (η=L÷(L+S)) is the proportion of the width dimension L of the electrode finger 6 in the periodic structure of the electrode finger 6. The metallization ratio η is equal to or less than 0.4, in this example, 0.2 to 0.4.

The conductive film (aluminum film) constituting the resonator 1 has a film thickness h. The film thickness h is set to a film thickness dimension that allows film formation by a realistic manufacturing method as describe later. Here, FIG. 2 illustrates a vertical cross-sectional view of the quartz substrate 10 taken along the line II-II in FIG. 1, and schematically illustrates the thickness dimensions of the quartz substrate 10, the IDT electrode 2, and similar member.

[Typical Surface Acoustic Wave Device]

Figure 3:
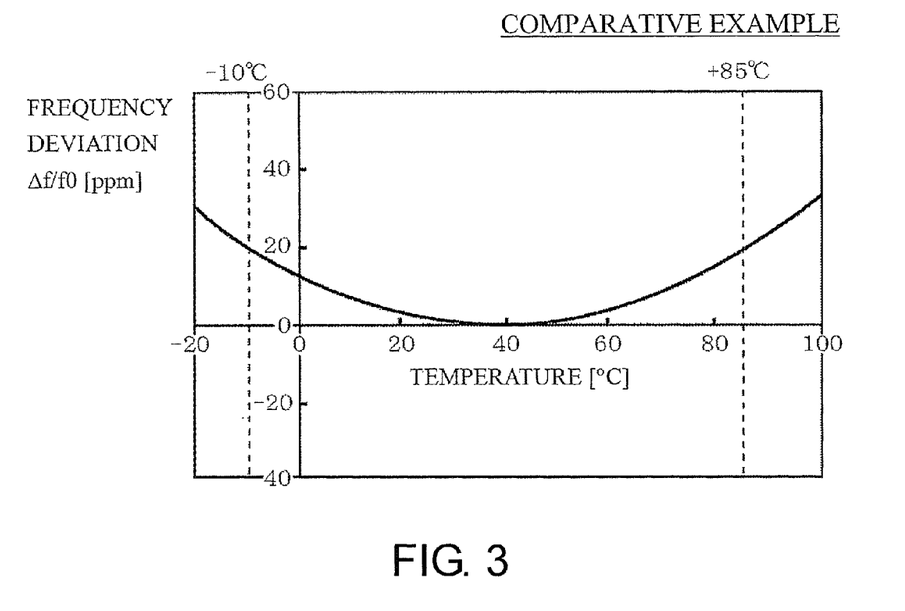
FIG. 3 is a characteristic diagram obtained for a typical surface acoustic wave device.

Here, the reason of the above-described configuration of the surface acoustic wave device will be described in detail after the configuration and the characteristics of a typical surface acoustic wave device is described first. The above-described angle θ is typically set to 15° to 16°. This angular range is known as the LST cut (see C. S. Lam, D. E. Holt, and K. Hashimoto, Proc. IEEE 1989 Ultrasonics Symposium, pp. 275-279; and M. Murota, T. Hirano, Y. Shimizu, C. S. Lam, and D. E. Holt, Proc. IEEE 1990 Ultrasonics Symposium, pp. 497-500). FIG. 3 illustrates a result obtained by a finite element analysis on representative frequency/temperature characteristics obtained in this LST cut. Here, the metallization ratio η, the angle θ, and the film thickness h are respectively 0.5, 16°, and 0.00413λ.

Figure 4:
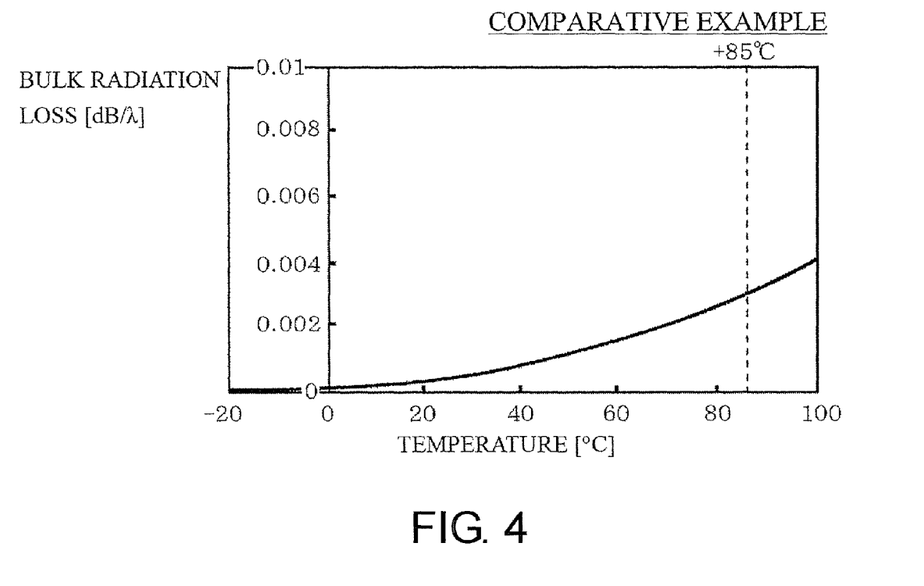
FIG. 4 is a characteristic diagram obtained for the typical surface acoustic wave device.

That is, in this analysis, the use temperature range is set to −10° C. to 85° C. such that the film thickness h of the resonator 1 is set to have a frequency deviation as small as possible within this temperature range (the apex of the above-described quadratic curve is set to 37.5° C. in the mid-range of the temperature). Accordingly, the frequency deviation in this temperature range is 23 ppm. FIG. 4 illustrates the correlation relationship between a bulk radiation loss and a temperature obtained in this LST cut. The bulk propagation loss increases as the temperature becomes higher. In the following description, a term "turnover temperature Tp" is used for the apex of the above-described quadratic curve.

On the quartz substrate 10 of this LST cut, the effective sound speed of the surface acoustic wave is 3949 m/s. Accordingly, to obtain, for example, a surface acoustic wave device that drives at 450 MHz, the period length λ is 8.76 μm. Thus, the film thickness h is 36.2 nm. This film thickness h is close to the lower limit value (35.0 nm) of the level that allows stable formation. Accordingly, as the drive frequency of the surface acoustic wave device becomes higher frequency in the bandwidth of 450 MHz or more, it becomes more difficult to manufacture the surface acoustic wave device.

Figure 5:
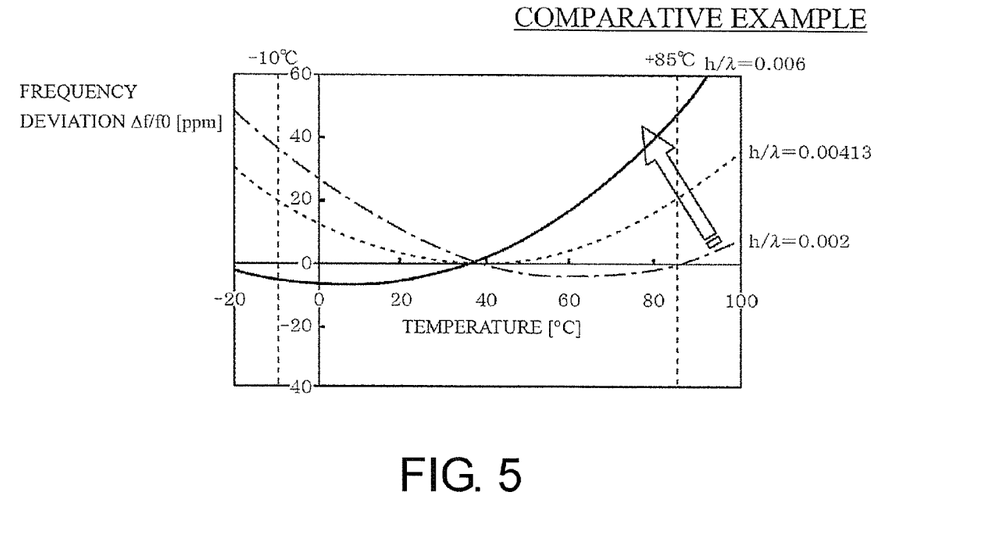
FIG. 5 is a characteristic diagram obtained for the typical surface acoustic wave device.
Figure 6:
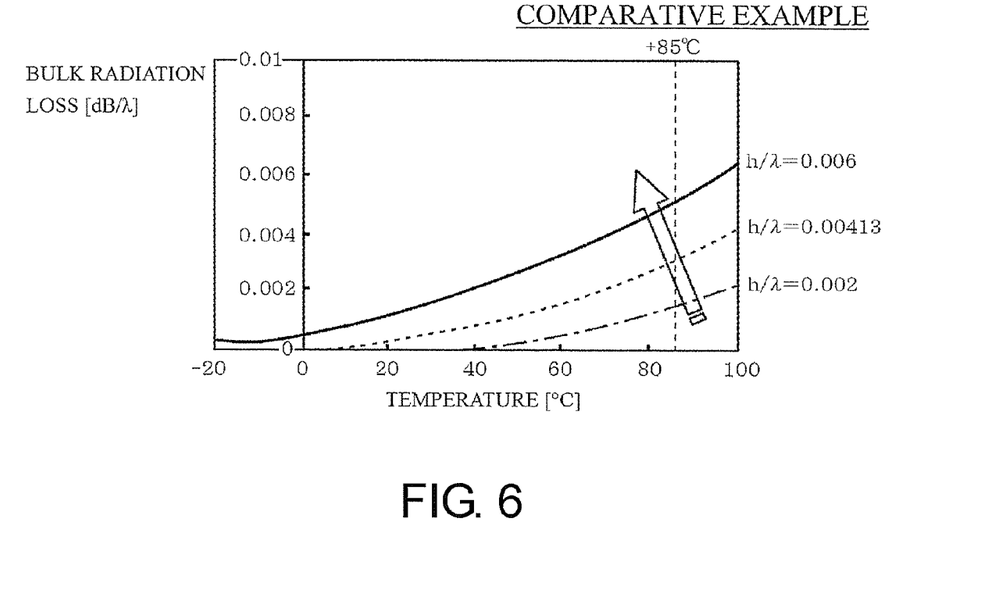
FIG. 6 is a characteristic diagram obtained for the typical surface acoustic wave device.
Figure 7:
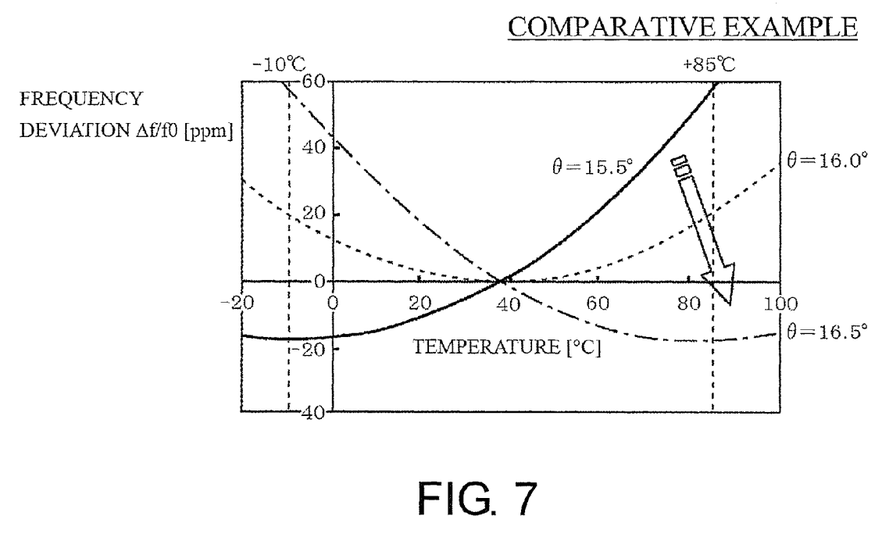
FIG. 7 is a characteristic diagram obtained for the typical surface acoustic wave device.
Figure 8:
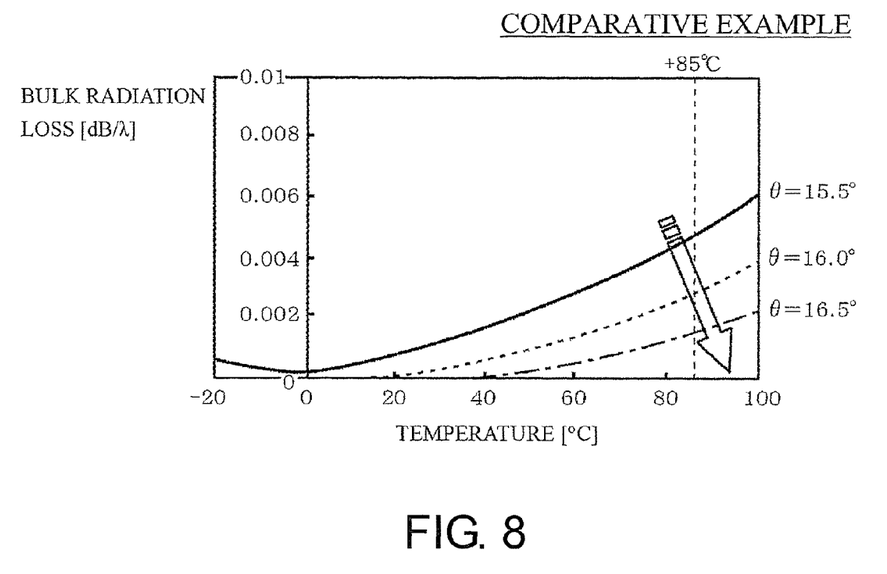
FIG. 8 is a characteristic diagram obtained for the typical surface acoustic wave device.

Here, FIG. 5 illustrates the correlation relationship between the temperature characteristic of the frequency deviation and the film thickness h (the wavelength-ratio film thickness h/λ) in the LST cut. FIG. 6 similarly illustrates the correlation relationship between the temperature characteristic of the bulk radiation loss and the film thickness h. FIG. 7 and FIG. 8 illustrate the respective results of dependencies with respect to the cut angle calculated for the temperature characteristic of the frequency deviation and the bulk radiation loss in the LST cut. As seen from FIG. 5, the turnover temperature Tp decreases with an increase (thickening) of the film thickness h. As seen from FIG. 7, the cut angle θ increases with an increase of the turnover temperature Tp.

Accordingly, it can be said that adjusting the cut angle θ allows setting the film thickness h to reduce the frequency-temperature deviation as much as possible, in other words, to set the turnover temperature Tp to 37.5° C. while increasing the film thickness h to the degree that allows film formation by the realistic manufacturing method. As seen from FIG. 6 and FIG. 8, the bulk radiation loss increases with an increase of the film thickness h while decreasing with an increase of the cut angle θ.

Figure 9:
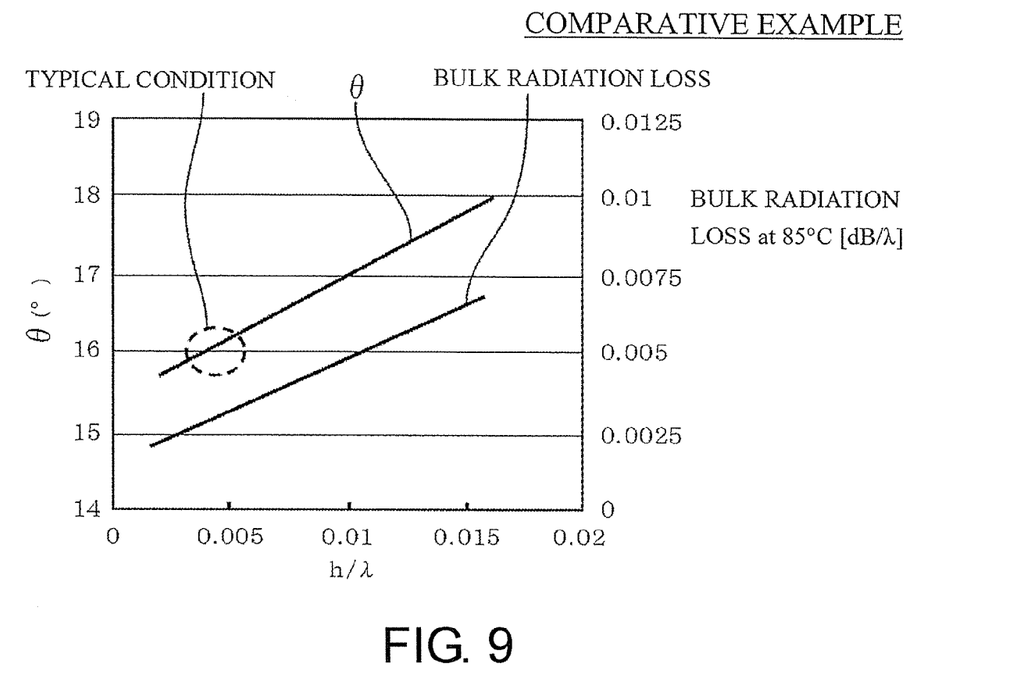
FIG. 9 is a characteristic diagram obtained for the typical surface acoustic wave device.

FIG. 9 illustrates the collected results of the correlation relationship between: the cut angle θ and the bulk radiation loss at 85° C., and the film thickness h when the turnover temperature Tp is set to 37.5° C. regarding the above-described results in FIG. 5 to FIG. 8. As seen from FIG. 9, increasing the film thickness h also allows selecting the cut angle θ that satisfies the turnover temperature Tp of 37.5° C. However, increasing the film thickness h causes an increase of the bulk radiation loss. That is, for ensuring a high-frequency surface acoustic wave device using the quartz substrate 10 in the LST cut, when the film thickness h is intended to be increased up to the level at which this surface acoustic wave device can be realistically manufactured, an increase of the loss occurs so as to lose the inductive region as a crystal unit. Accordingly, in the case where the LST cut is used, the typical method has a limitation in increasing the drive frequency. The upper limit of the drive frequency is, for example, 450 MHz. Taking into consideration the loss, the upper limit of the cut angle θ that can be realistically used was 16°.

[Surface Acoustic Wave Device of this Disclosure]

Therefore, in this disclosure, the film thickness h that allows realistic manufacture is set. Further, the bulk radiation loss is controlled to be as small as possible while the turnover temperature Tp is maintained at 37.5° C. (while the temperature characteristic of the frequency deviation is maintained as small as possible). That is, the above-described typical calculation is premised on setting the metallization ratio η to 0.5 (the width dimension L: the separation dimension S=1:1). Accordingly, the metallization ratio η has not been set as a target of evaluation together with the film thickness h and the cut angle θ.

Figure 10:
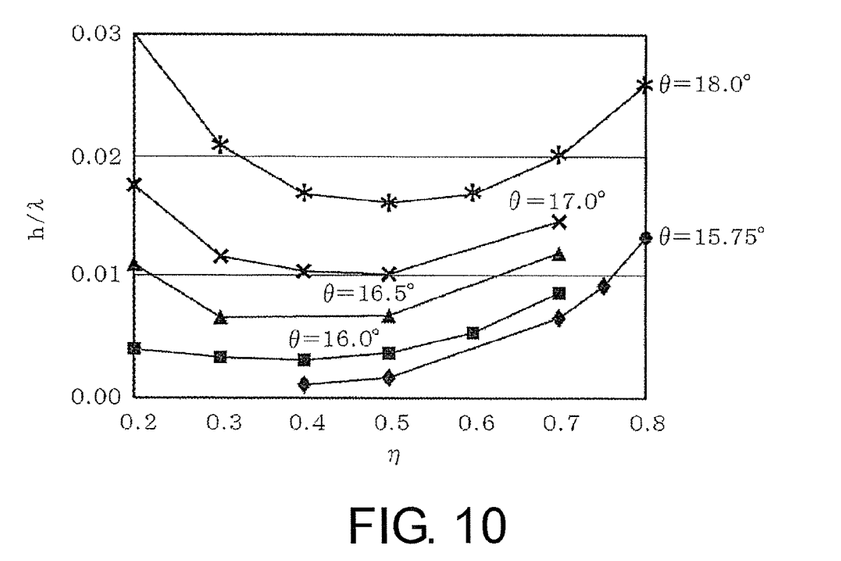
FIG. 10 is a characteristic diagram obtained for the surface acoustic wave device of this disclosure.

In contrast, in this disclosure, in addition to the film thickness h and the cut angle θ, the metallization ratio η is also evaluated. Specifically, as illustrated in FIG. 10, the metallization ratio η and the cut angle θ were analyzed under the condition that the turnover temperature Tp is maintained at 37.5° C. As seen from FIG. 10, it can be said that the metallization ratio η is preferred to be set to be equal to or less than 0.4 or equal to or more than 0.6 compared with 0.5 to increase the film thickness h as much as possible.

Figure 11:
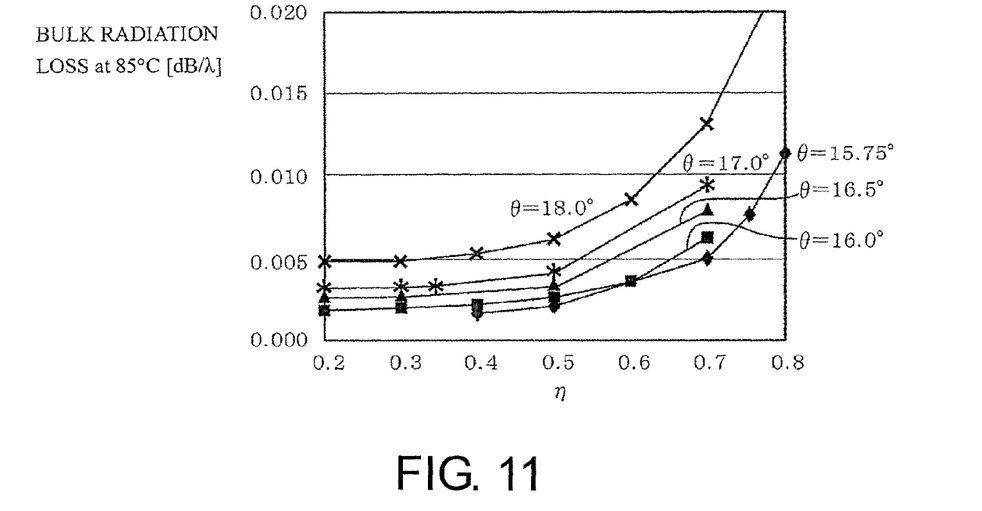
FIG. 11 is a characteristic diagram obtained for the surface acoustic wave device of this disclosure.

On the other hand, FIG. 11 illustrates the result of analysis on dependencies of the metallization ratio η and the cut angle θ for the bulk radiation loss at 85° C. The bulk radiation loss degrades (increases) as the metallization ratio η is increased regardless of the cut angle θ. Accordingly, from the results of FIG. 10 and FIG. 11 described above, it can be said that setting the metallization ratio is preferred to be equal to or less than 0.4 so as to increase the film thickness h while reducing the bulk radiation loss. As one example, the metallization ratio η was set to 0.3 compared with the case where the metallization ratio η was set to 0.5. In this case, it is found that the bulk radiation loss at 85° C. can be reduced by about 20% while the film thickness h can be increased by about 20% to 30%. Thus, setting the metallization ratio η to be equal to or less than 0.4 as described above is effective for ensuring a high-frequency surface acoustic wave device.

[Measurement Result]

Therefore, a practical resonator was experimentally produced under the following conditions so as to oscillate at 2 GHz using 17.6° that exceeds 16° as the upper limit of the cut angle θ in the LST cut, and then the characteristics were evaluated. Here, the "length dimension" in the following conditions indicates the length dimension in the propagation direction of the surface acoustic wave. Additionally, the "aperture" means the length dimension between the busbars 5.

(Conditions)
Cut Angle θ: 17.6°
Metallization Ratio η: 0.3
Period Length λ: 1.948 μm
Length Dimension of IDT Electrode: 200λ
Length Dimension of Reflector: 150λ
Aperture: 20λ

When the actual dimension of this resonator was measured, the metallization ratio η was 0.292. The film thickness h was 1.802%λ=35.1 nm.

Figure 12:
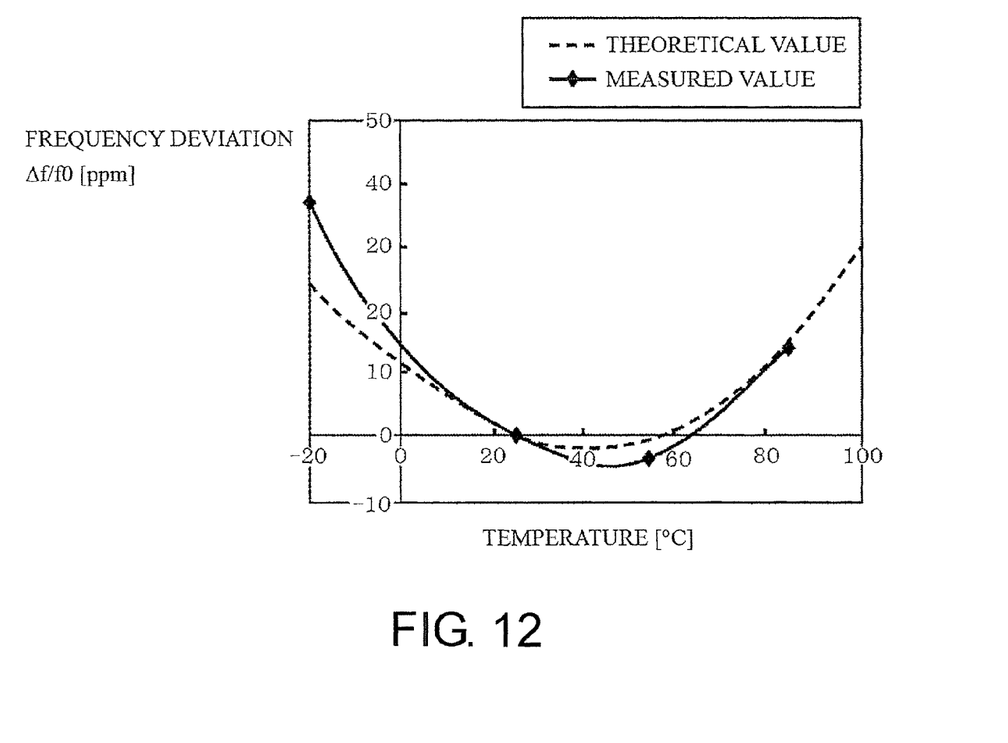
FIG. 12 is a characteristic diagram obtained for the surface acoustic wave device of this disclosure.
Figure 13:
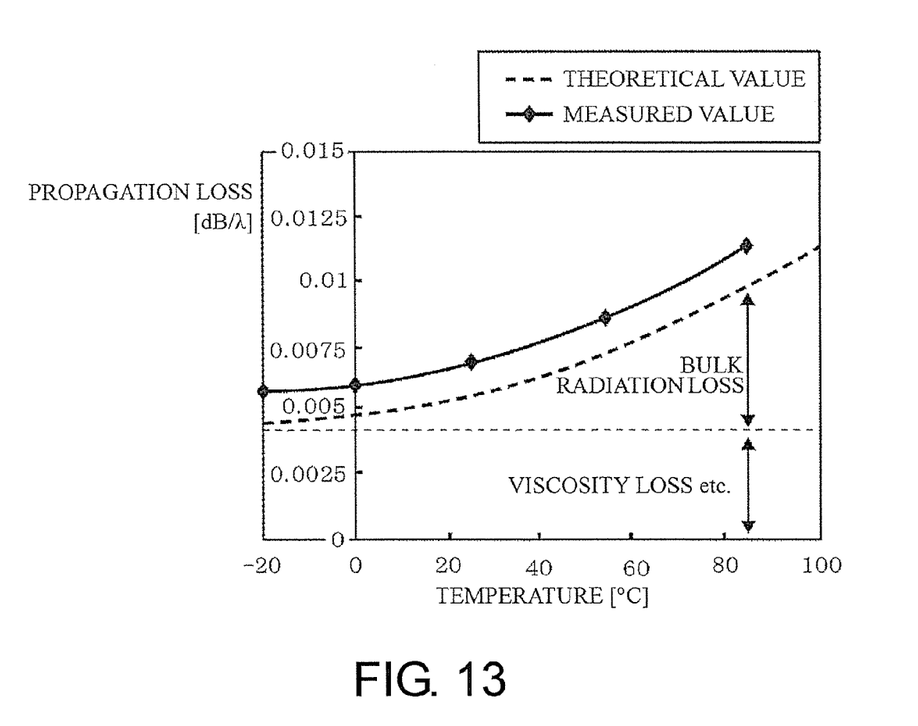
FIG. 13 is a characteristic diagram obtained for the surface acoustic wave device of this disclosure.

FIG. 12 and FIG. 13 illustrate the results of comparison between the characteristics obtained in an actually manufactured resonator (hereinafter referred to as a "manufactured product") and the characteristics obtained by analysis. In FIG. 12, the turnover temperature Tp is plotted approximately in the center of the use temperature. While little distortion considered to be caused by influence of the portion that supports the quartz substrate 10 was found, the temperature characteristic of the frequency deviation of the manufactured product was almost along the analysis result. The propagation loss (loss at 85° C.) illustrated in FIG. 13 was 0.0101 dB/λ in the analysis. Accordingly, while Q was predicted to be about 2700, Q was 2371 in the actual measurement. Therefore, regarding the loss, the measured value is close to the analytical value in the result. Here, for the propagation loss illustrated in FIG. 13, the loss based on the viscosity of the quartz substrate 10 or similar loss is added in addition to the bulk radiation loss described in the respective examples described above.

Figure 14:
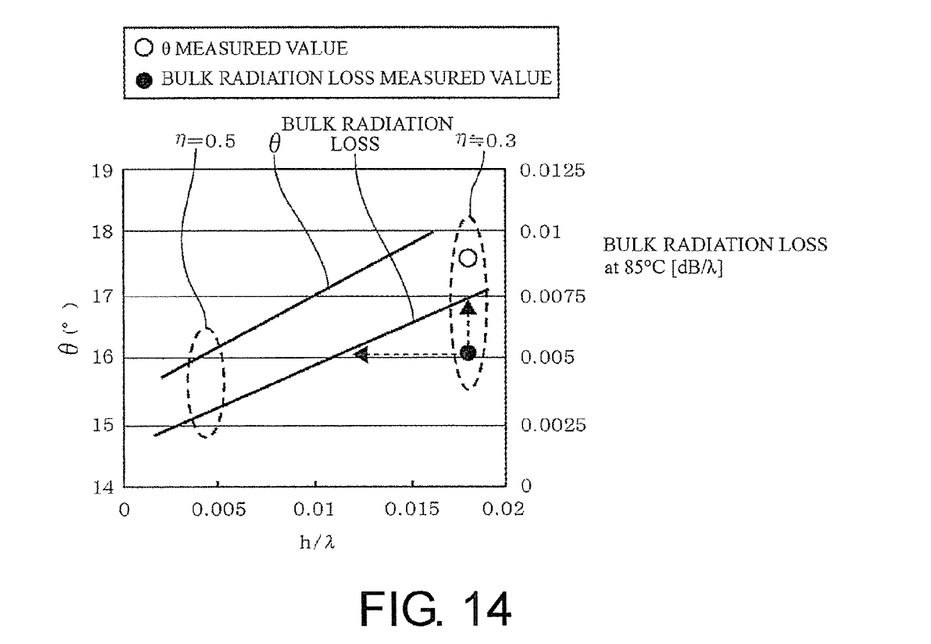
FIG. 14 is a characteristic diagram obtained for the surface acoustic wave device of this disclosure.

FIG. 14 illustrates a graph where the measurement result (η≈0.3) obtained in this resonator is plotted on FIG. 9 described above. The correspondence relationship between the cut angle θ, the bulk radiation loss, and the film thickness h in this measurement result is plotted in the region off from the straight line obtained when the metallization ratio η illustrated in FIG. 9 is 0.5. Specifically, when the metallization ratio η is set to about 0.3, both of the cut angle θ and the bulk radiation loss are smaller than the straight line obtained in the case where the metallization ratio η is set to 0.5.

Accordingly, in the typical method in which the metallization ratio η is set to 0.5, to hold the bulk radiation loss to be similar to the measurement result in this disclosure, the film thickness h becomes 1.06%λ=20.6 nm as illustrated by the arrow of the dashed line extending along the X-axis in FIG. 14. Accordingly, the film thickness h becomes thin to the level that the production is extremely difficult or impossible. On the other hand, similarly, as illustrated by the arrow of the dashed line extending in the Y-axis direction in FIG. 14, in the case where the metallization ratio η is set to 0.5, the bulk radiation loss is increased by 34% when the film thickness h similar to the measurement result in this disclosure is intended to be maintained. Accordingly, Q is predicted to decrease (degrades) from 2700 up to 2285. Further, in the practical resonator, Q is expected to further degrade.

When an oscillator is configured by incorporating the above-described manufactured product in a Colpitts oscillation circuit, in the sine wave output, the phase noise became −100 dBc/Hz (the measurement result at the frequency offset by 1 kHz from the output frequency). Additionally, jitter became 9.5 fsec (the result obtained from the frequency offset by 12 kHz with respect to the output frequency over the frequency offset by 20 MHz). Therefore, the characteristics were appropriate as the circuit that directly causes oscillation by the resonator using SAW. Accordingly, in this oscillator circuit, the loss decreases compared with the case where the typical LST cut is used and the frequency/temperature characteristics becomes excellent compared with the case where the above-described ST cut is used. Further, the oscillator circuit of this disclosure directly causes the resonator to oscillate the input signal to the oscillator circuit. Accordingly, the phase noise is reduced compared with the oscillator circuit constituted to multiply the frequency lower than this input signal.

With the above-described embodiment, the quartz substrate 10 is constituted such that the cut angle θ becomes 16°<θ≤18.5° and the metallization ratio η is set to 0.4 or less. This allows reducing the bulk radiation loss while maintaining the temperature characteristic of the frequency deviation as small as possible even when the film thickness h is increased to the extent that realistic manufacture is possible. Accordingly, as described above, the resonator 1 that properly oscillates can be obtained even in a high bandwidth exceeding 600 MHz, specifically, a bandwidth of 2 GHz. Thus, using this resonator 1 allows the configuration of the oscillator circuit in which the loss is small, the temperature characteristic of the frequency deviation is excellent, and the noise level is low.

Figure 15:
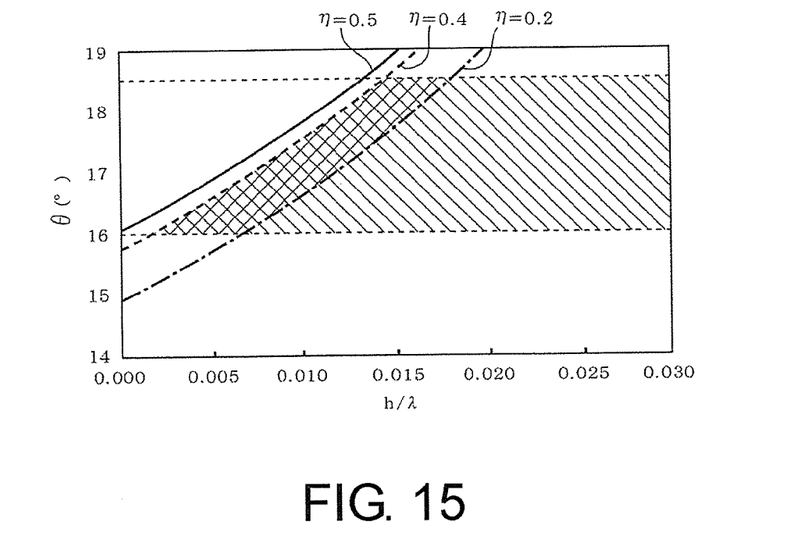
FIG. 15 is a characteristic diagram obtained for the surface acoustic wave device of this disclosure.

Here, a description will be given of a preferred numerical value range collectively considering three parameters the cut angle θ, the metallization ratio η, and the wavelength-ratio film thickness h/λ. FIG. 15 illustrates a graph expressing the analysis result of the correlation relationship between the wavelength-ratio film thickness h/λ and the cut angle θ when the metallization ratio η is set to 0.5 as the following formula (1).

$$h/\lambda = -0.0004 \times \theta^2 + 0.0192 \times \theta - 0.205 \quad \text{(Formula (1): } \eta = 0.5\text{)}$$

From the result of this formula (1), the respective correlation relationship between the wavelength-ratio film thickness h/λ and the cut angle θ when the metallization ratio η is 0.4 and 0.2 are similarly mathematized as the following formula (2) and formula (3).

$$h/\lambda = -0.0004 \times \theta^2 + 0.0189 \times \theta - 0.1983 \quad \text{(Formula (2): } \eta = 0.4\text{)}$$

$$h/\lambda = -0.0004 \times \theta^2 + 0.0184 \times \theta - 0.1853 \quad \text{(Formula (3): } \eta = 0.2\text{)}$$

Accordingly, when the metallization ratio η is set to 0.4 or less as described above, the wavelength-ratio film thickness h/λ becomes a value in the range same as the value on the right-hand side or larger than the value on the right-hand side of the formula (2). The wavelength-ratio film thickness h/λ in this case is expressed by a specific formula as follows.

$$h/\lambda \geq -0.0004 \times \theta^2 + 0.0189 \times \theta - 0.1983$$

In the range of this wavelength-ratio film thickness h/λ, the region (the range targeted by the surface acoustic wave device of this disclosure) overlapping with the range of the cut angle θ already described in detail becomes the region on the right side with respect to the curve of "η=0.4" in the region sandwiched between the respective lines passing through "θ=16" and "θ=18.5" in parallel to the horizontal axis in FIG. 15. Additionally, in the case where the metallization ratio η is set to 0.2 to 0.4, the wavelength-ratio film thickness h/λ becomes the value in a range between the value on the right-hand side of the formula (3) and the value on the right-hand side of the formula (2). Similarly, this is expressed by formulas as follows.

$$h/\lambda \geq -0.0004 \times \theta^2 + 0.0189 \times \theta - 0.1983$$

$$h/\lambda \leq -0.0004 \times \theta^2 + 0.0184 \times \theta - 0.1853$$

In this case, the range targeted by the surface acoustic wave device of this disclosure becomes the region surrounded by the respective lines passing through "θ=16" and "θ=18.5" in parallel to the horizontal axis, the curve of "η=0.4," and the curve of "η=0.2" in FIG. 15.

Figure 16:
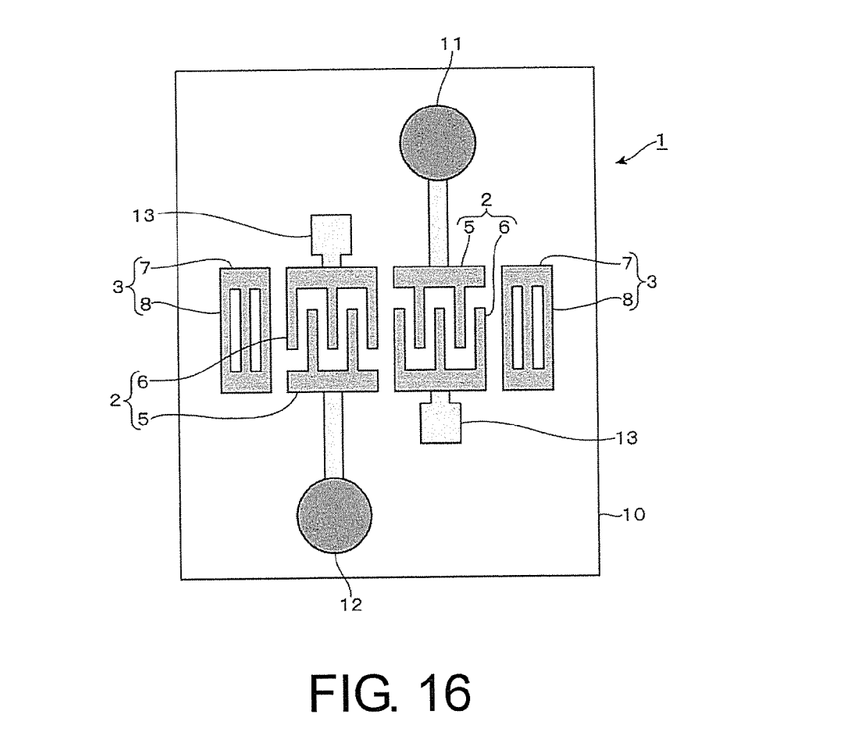
FIG. 16 is a plan view illustrating another example of the surface acoustic wave device of this disclosure.

FIG. 16 illustrates another example of the above-described surface acoustic wave device. Specifically, as the surface acoustic wave device, the resonator 1 constituted as a two-port type is illustrated. That is, the IDT electrodes 2 are disposed in two positions adjacent to each other along the propagation direction of the surface acoustic wave. The busbar 5 of one IDT electrode 2 among these IDT electrodes 2 and 2 connects to the input port 11 while the busbar 5 of the other IDT electrode 2 connects to the output port 12. The respective busbars 5 without connecting to these ports 11 and 12 are grounded via grounding ports 13. The above-described reflectors 3 are disposed to sandwich the arrangement of these IDT electrodes 2 and 2.

Figure 17:
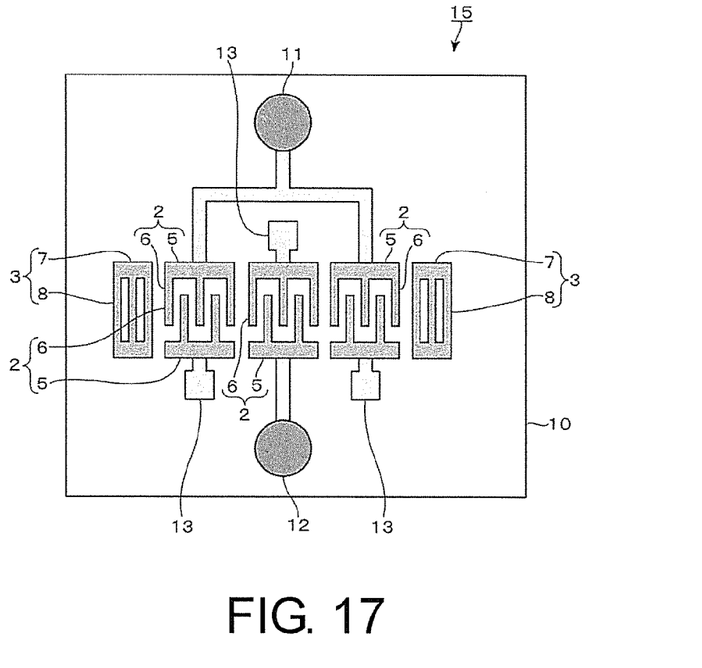
FIG. 17 is a plan view illustrating another example of the surface acoustic wave device of this disclosure.

FIG. 17 illustrates an exemplary configuration of a longitudinal resonator filter 15 as the surface acoustic wave device. That is, on the quartz substrate 10, a plurality of, for example, three IDT electrodes 2 are disposed along the propagation direction of the surface acoustic wave. The respective reflectors 3 are formed on one side and the other side in the arrangement of these IDT electrodes 2 in the propagation direction. Among these three IDT electrodes 2, the busbars 5 of the IDT electrodes 2 and 2 on both right and left ends connect to the input port 11 in common, and the busbar 5 of the IDT electrode 2 at the center connects to the output port 12.

Figure 18:
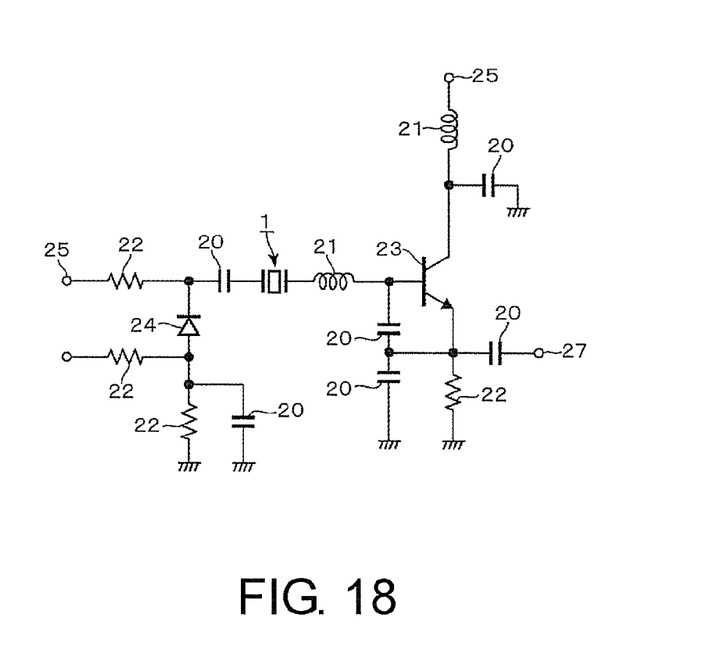
FIG. 18 is a circuit diagram illustrating an exemplary oscillator circuit of this disclosure.

FIG. 18 illustrates an exemplary oscillator circuit using the above-described resonator 1. Specifically, this oscillator circuit illustrates a voltage control oscillator (VCO), and employs the configuration using a Colpitts circuit combining a capacitor 20, an inductor 21, a resistor 22, a transistor 23, and a diode 24 together. Between the base terminal of the transistor 23 and an input terminal 25, the above-described resonator 1 is interposed. That is, the input terminal 25 connects to the input port 11 and the base terminal of the transistor 23 connects to the output port 12. In FIG. 18, a port 26 and an output terminal 27 are illustrated. To the port 26, a voltage for driving the transistor 23 is applied.

In this disclosure, instead of the above-described IDT electrode 2 or together with the IDT electrode 2, the reflector 3 may be used as the periodic structure portion. Alternatively, in the case where the reflector 3 is used as the periodic structure portion, it is possible to employ the configuration where, in a sense, both ends of the reflector electrode finger 8 in the longitudinal direction are opened while the reflector busbar 7 is not disposed.

In the periodic structure portion, the width dimension and the separation dimension may be set such that a surface acoustic wave with a wavelength corresponding to a frequency of 600 MHz to 2 GHz propagates. When a wavelength of the surface acoustic wave to propagate on the quartz substrate corresponding to an arrangement period of the electrodes is referred to as a period length λ and a film thickness dimension of the electrode is defined as h, a wavelength-ratio film thickness h/λ that is a value obtained by dividing the film thickness dimension h by the period length λ may have a range expressed by a following formula that is a function of the cut angle θ.

$$h/\lambda \geq -0.0004 \times \theta^2 + 0.0189 \times \theta - 0.1983$$

Additionally, the wavelength-ratio film thickness h/λ may have a range expressed by a following formula.

$$h/\lambda \leq -0.0004 \times \theta^2 + 0.0184 \times \theta - 0.1853$$

A resonator of this disclosure includes the periodic structure portion, busbars, and a reflector. The busbars are disposed to extend along the propagation direction on one end side and another end side in a longitudinal direction of each electrode such that the electrodes alternately intersect with one another in a comb shape so as to form an IDT electrode in the periodic structure portion. The reflector includes reflector electrode fingers and reflector busbars. The reflector electrode fingers are disposed in a plurality of positions separated from one another along the propagation direction. The reflector electrode fingers extend along the electrode. The reflector electrode fingers are disposed on both sides of the propagation direction viewed from the periodic structure portion. Reflector busbars connect respective one end sides to one another and connect respective another end sides to one another in the reflector electrode fingers. An oscillator circuit of this disclosure includes the resonator.

According to this disclosure, the quartz substrate is constituted such that the surface acoustic wave propagates on the surface with the Euler angle of (0°, θ (16°<θ≤18.5°), 0°). Additionally, the periodic structure portion is constituted by periodically arranging the electrodes on the quartz substrate corresponding to the wavelength of this surface acoustic wave. When the width dimension of the electrode and the separation dimension between the electrodes adjacent to one another are respectively defined as L and S, the metallization ratio η (η=L÷(L+S)) is set to 0.4 or less. Accordingly, as seen from the results of simulations described later, this allows reducing the loss and the frequency deviation of the device even when the film thickness of the electrode is increased to the extent that realistic manufacture is possible.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface acoustic wave device, comprising:
    a quartz substrate constituted such that a surface acoustic wave is to propagate on a surface with an Euler angle of (0°, θ, 0°), a cut angle θ having 16°<θ≤18.5°; and
    a periodic structure portion disposed on the quartz substrate, the periodic structure portion including a plurality of electrodes extending in a direction intersecting with a direction of the propagation of the surface acoustic wave, the electrodes being disposed in parallel to one another along the propagation direction, the periodic structure portion being constituted to mainly contain aluminum, wherein
    when a width dimension of the electrode in the propagation direction and a separation dimension between the electrodes adjacent to one another are respectively defined as L and S, a metallization ratio η (η=L÷(L+S)) is set to 0.4 or less.

2. The surface acoustic wave device according to claim 1, wherein
    the periodic structure portion has the width dimension and the separation dimension such that the surface acoustic wave with a wavelength corresponding to a frequency of 600 MHz to 2 GHz propagates.

3. The surface acoustic wave device according to claim 1, wherein
    assuming that a wavelength of the surface acoustic wave to propagate on the quartz substrate corresponding to an arrangement period of the electrodes is a period length λ and a film thickness dimension of the electrode is h, a wavelength-ratio film thickness h/λ that is a value obtained by dividing the film thickness dimension h by the period length λ has a range expressed by a following formula that is a function of the cut angle θ:

$$h/\lambda \geq -0.0004 \times \theta^2 + 0.0189 \times \theta - 0.1983.$$

4. The surface acoustic wave device according to claim 2, wherein
    assuming that a wavelength of the surface acoustic wave to propagate on the quartz substrate corresponding to an arrangement period of the electrodes is a period length λ and a film thickness dimension of the electrode is h, a wavelength-ratio film thickness h/λ that is a value obtained by dividing the film thickness dimension h by the period length λ has a range expressed by a following formula that is a function of the cut angle θ:

$$h/\lambda \geq -0.0004 \times \theta^2 + 0.0189 \times \theta - 0.1983.$$

5. The surface acoustic wave device according to claim 3, wherein
    the wavelength-ratio film thickness h/λ has a range expressed by a following formula:

$$h/\lambda \leq -0.0004 \times \theta^2 + 0.0184 \times \theta - 0.1853.$$

6. The surface acoustic wave device according to claim 4, wherein
    the wavelength-ratio film thickness h/λ has a range expressed by a following formula:

$$h/\lambda \leq -0.0004 \times \theta^2 + 0.0184 \times \theta - 0.1853.$$

7. The surface acoustic wave device according to claim 1, further comprising:
    busbars disposed to extend along the propagation direction on one end side and another end side in a longitudinal direction of each electrode such that the electrodes alternately intersect with one another in a comb shape so as to form an IDT electrode in the periodic structure portion; and
    a reflector that includes:
        reflector electrode fingers, disposed in a plurality of positions separated from one another along the propagation direction, the reflector electrode fingers extending along the electrode, the reflector electrode fingers being disposed on both sides of the propagation direction viewed from the periodic structure portion; and
        reflector busbars that connect respective one end sides to one another and connect respective another end sides to one another in the reflector electrode fingers, wherein
    the surface acoustic wave device functions as a resonator.

8. The surface acoustic wave device according to claim 2, further comprising:
busbars disposed to extend along the propagation direction on one end side and another end side in a longitudinal direction of each electrode such that the electrodes alternately intersect with one another in a comb shape so as to form an IDT electrode in the periodic structure portion; and
a reflector that includes:
reflector electrode fingers, disposed in a plurality of positions separated from one another along the propagation direction, the reflector electrode fingers extending along the electrode, the reflector electrode fingers being disposed on both sides of the propagation direction viewed from the periodic structure portion; and
reflector busbars that connect respective one end sides to one another and connect respective another end sides to one another in the reflector electrode fingers, wherein
the surface acoustic wave device functions as a resonator.

9. The surface acoustic wave device according to claim 3, further comprising:
busbars disposed to extend along the propagation direction on one end side and another end side in a longitudinal direction of each electrode such that the electrodes alternately intersect with one another in a comb shape so as to form an IDT electrode in the periodic structure portion; and
a reflector that includes:
reflector electrode fingers, disposed in a plurality of positions separated from one another along the propagation direction, the reflector electrode fingers extending along the electrode, the reflector electrode fingers being disposed on both sides of the propagation direction viewed from the periodic structure portion; and
reflector busbars that connect respective one end sides to one another and connect respective another end sides to one another in the reflector electrode fingers, wherein
the surface acoustic wave device functions as a resonator.

10. The surface acoustic wave device according to claim 4, further comprising:
busbars disposed to extend along the propagation direction on one end side and another end side in a longitudinal direction of each electrode such that the electrodes alternately intersect with one another in a comb shape so as to form an IDT electrode in the periodic structure portion; and
a reflector that includes:
reflector electrode fingers, disposed in a plurality of positions separated from one another along the propagation direction, the reflector electrode fingers extending along the electrode, the reflector electrode fingers being disposed on both sides of the propagation direction viewed from the periodic structure portion; and
reflector busbars that connect respective one end sides to one another and connect respective another end sides to one another in the reflector electrode fingers, wherein
the surface acoustic wave device functions as a resonator.

11. The surface acoustic wave device according to claim 5, further comprising:
busbars disposed to extend along the propagation direction on one end side and another end side in a longitudinal direction of each electrode such that the electrodes alternately intersect with one another in a comb shape so as to form an IDT electrode in the periodic structure portion; and
a reflector that includes:
reflector electrode fingers, disposed in a plurality of positions separated from one another along the propagation direction, the reflector electrode fingers extending along the electrode, the reflector electrode fingers being disposed on both sides of the propagation direction viewed from the periodic structure portion; and
reflector busbars that connect respective one end sides to one another and connect respective another end sides to one another in the reflector electrode fingers, wherein
the surface acoustic wave device functions as a resonator.

12. The surface acoustic wave device according to claim 6, further comprising:
busbars disposed to extend along the propagation direction on one end side and another end side in a longitudinal direction of each electrode such that the electrodes alternately intersect with one another in a comb shape so as to form an IDT electrode in the periodic structure portion; and
a reflector that includes:
reflector electrode fingers, disposed in a plurality of positions separated from one another along the propagation direction, the reflector electrode fingers extending along the electrode, the reflector electrode fingers being disposed on both sides of the propagation direction viewed from the periodic structure portion; and
reflector busbars that connect respective one end sides to one another and connect respective another end sides to one another in the reflector electrode fingers, wherein
the surface acoustic wave device functions as a resonator.

13. An oscillator circuit, comprising:
the surface acoustic wave device according to claim 7.

14. An oscillator circuit, comprising:
the surface acoustic wave device according to claim 8.

15. An oscillator circuit, comprising:
the surface acoustic wave device according to claim 9.

16. An oscillator circuit, comprising:
the surface acoustic wave device according to claim 10.

17. An oscillator circuit, comprising:
the surface acoustic wave device according to claim 11.

18. An oscillator circuit, comprising:
the surface acoustic wave device according to claim 12.

19. A surface acoustic wave device, comprising:
a quartz substrate constituted such that a surface acoustic wave is to propagate on a surface with an Euler angle of (0°, θ, 0°), a cut angle θ having $16°<θ≤18.5°$, wherein the cut angle θ having $16°<θ≤18.5°$ is larger than a cut angle θ' having $15°≤θ'≤16°$ of an LST-cut quartz substrate, wherein an upper limit of the cut angle θ' of the LST-cut quartz substrate is 16°; and
a periodic structure portion disposed on the quartz substrate, the periodic structure portion including a plurality of electrodes extending in a direction intersecting with a direction of the propagation of the surface acoustic wave, the electrodes being disposed in parallel to one another along the propagation direction, the periodic structure portion being constituted to mainly contain aluminum, wherein when a width dimension of the electrode in the propagation direction and a separation dimension between the electrodes adjacent to one another are respectively defined as L and S, a metallization ratio $\eta$ ($\eta=L\div(L+S)$) is set to 0.4 or less.

* * * * *